(12) United States Patent
Handa

(10) Patent No.: US 12,733,298 B2
(45) Date of Patent: Sep. 8, 2026

(54) DISPLAY DEVICE

(71) Applicant: Sharp Display Technology Corporation, Kameyama City (JP)

(72) Inventor: Shinichi Handa, Kameyama City (JP)

(73) Assignee: Sharp Display Technology Corporation, Kameyama City (JP)

( * ) Notice: Subject to any disclaimer, the term of this patent is extended or adjusted under 35 U.S.C. 154(b) by 366 days.

(21) Appl. No.: 18/693,000

(22) PCT Filed: Nov. 24, 2021

(86) PCT No.: PCT/JP2021/043048
§ 371 (c)(1),
(2) Date: Mar. 18, 2024

(87) PCT Pub. No.: WO2023/095220
PCT Pub. Date: Jun. 1, 2023

(65) Prior Publication Data

US 2024/0395973 A1 Nov. 28, 2024

(51) Int. Cl.
*H10H 20/831* (2025.01)
*H10H 20/832* (2025.01)
*H10H 20/857* (2025.01)
*H10W 90/00* (2026.01)

(52) U.S. Cl.
CPC ........ *H10H 20/831* (2025.01); *H10H 20/835* (2025.01); *H10H 20/857* (2025.01); *H10W 90/00* (2026.01)

(58) Field of Classification Search
CPC .... H05B 33/12; H10H 20/831; H10H 20/835; H10H 20/837; H10W 90/00
See application file for complete search history.

(56) References Cited

U.S. PATENT DOCUMENTS

2014/0001457 A1 1/2014 Endo
2021/0399264 A1* 12/2021 Ueda .................... H10K 59/38

FOREIGN PATENT DOCUMENTS

JP 2012-195054 A 10/2012

* cited by examiner

*Primary Examiner* — Marlon T Fletcher
*Assistant Examiner* — Samuel Jonathan Smith
(74) *Attorney, Agent, or Firm* — ScienBiziP, P.C.

(57) ABSTRACT

This display device includes a first light-emitting element and a second light-emitting element connected in series, and a third light-emitting element and a fourth light-emitting element connected in series. The first light-emitting element and the second light-emitting element share a second electrode formed in an upper layer above a first light-emitting layer and a second light-emitting layer, and the third light-emitting element and the fourth light-emitting element share a fourth electrode formed in an upper layer above a third light-emitting layer and a fourth light-emitting layer. The second electrode is an island-shaped electrode and functions as a cathode of one of the first light-emitting element and the second light-emitting element and an anode of the other, and the fourth electrode is an island-shaped electrode and functions as a cathode of one of the third light-emitting element and the fourth light-emitting element and an anode of the other.

20 Claims, 10 Drawing Sheets

DISPLAY DEVICE

TECHNICAL FIELD

The disclosure relates to a display device.

BACKGROUND ART

JP 2012-195054 A discloses a tandem structure in which a plurality of light-emitting layers are layered in a current path of a light-emitting element.

CITATION LIST

Patent Literature

SUMMARY

Technical Problem

The tandem structure is problematic in that a layer quantity increases significantly.

Solution to Problem

A display device according to an aspect of the disclosure includes a first subpixel including a first light-emitting element and a second light-emitting element connected in series, and a second subpixel including a third light-emitting element and a fourth light-emitting element connected in series. The first light-emitting element includes a first electrode and a first light-emitting layer, the second light-emitting element includes a second light-emitting layer, the first light-emitting element and the second light-emitting element share a second electrode formed in an upper layer above the first light-emitting layer and the second light-emitting layer, the third light-emitting element includes a third electrode and a third light-emitting layer, the fourth light-emitting element includes a fourth light-emitting layer, the third light-emitting element and the fourth light-emitting element share a fourth electrode formed in an upper layer above the third light-emitting layer and the fourth light-emitting layer, the second electrode is an island-shaped electrode and functions as a cathode of one of the first light-emitting element and the second light-emitting element and an anode of the other, and the fourth electrode is an island-shaped electrode and functions as a cathode of one of the third light-emitting element and the fourth light-emitting element and an anode of the other.

Advantageous Effects of Disclosure

According to an aspect of the present disclosure, it is possible to arrange a plurality of light-emitting layers in a current path of a subpixel and increase an external quantum efficiency while suppressing an increase in a layer quantity.

DESCRIPTION OF EMBODIMENTS

Figure 1:
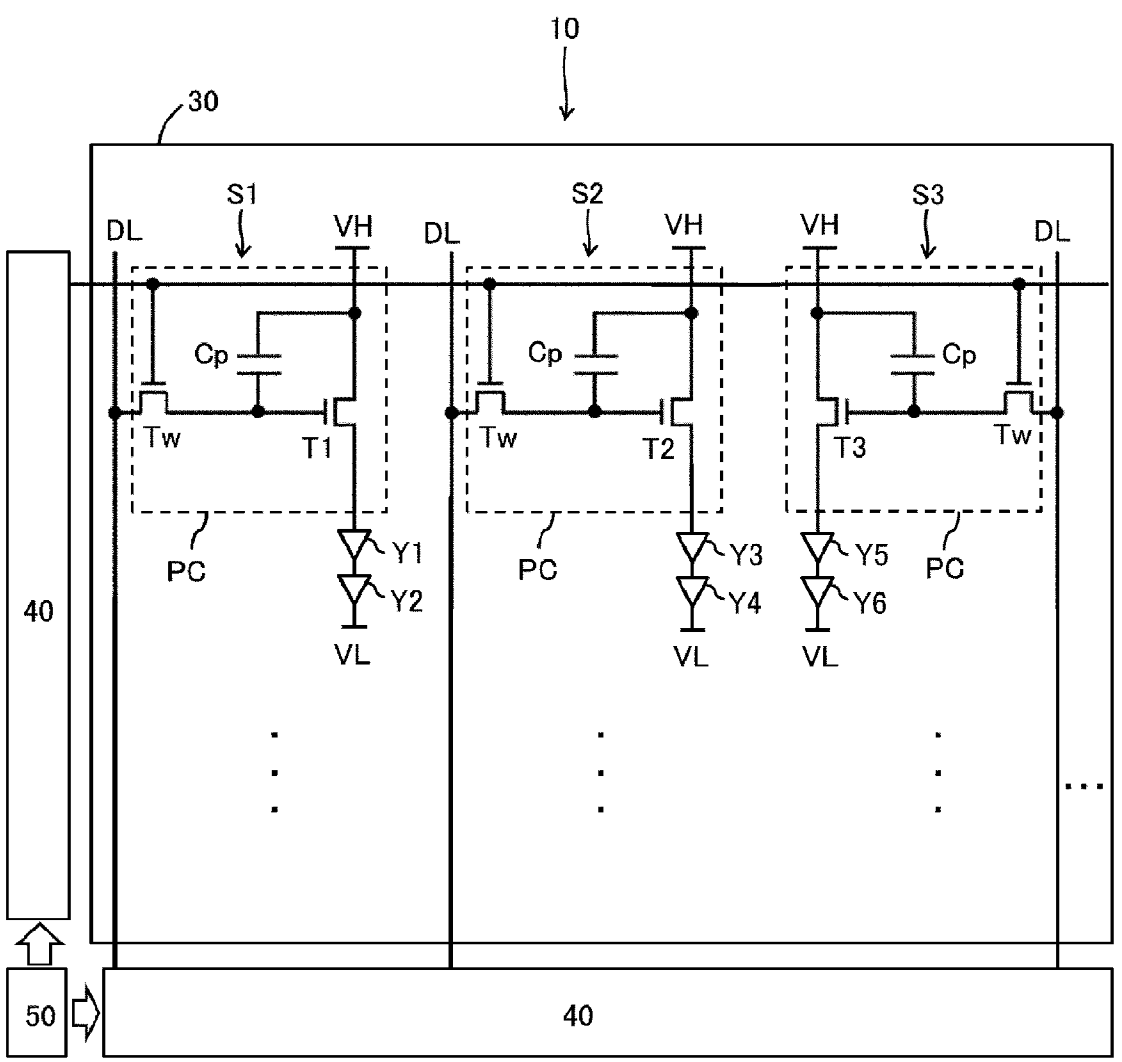
FIG. 1 is a schematic view illustrating a configuration of a display device according to the present embodiment.

FIG. 1 is a schematic view illustrating a configuration of a display device according to the present embodiment. As illustrated in FIG. 1, a display device 10 includes a display portion 30, a drive unit (driver circuit) 40 that drives the display portion 30, and a control unit 50 that controls the drive unit 40. The control unit 50 may include a processor and a memory.

The display portion 30 includes a first subpixel S1 including first and second light-emitting elements Y1, Y2 connected in series and a pixel circuit PC, a second subpixel S2 including third and fourth light-emitting elements Y3, Y4 connected in series and a pixel circuit PC, and a third subpixel S3 including fifth and sixth light-emitting elements Y5, Y6 connected in series and a pixel circuit PC. As the first to sixth light-emitting elements Y1 to Y6, for example, organic light-emitting diodes (OLEDs) or quantum dot light-emitting elements (QLEDs) can be used.

In the first subpixel S1, a gate of a transistor T1 (drive transistor) is connected to a data signal line via a transistor Tw, the gate of the transistor T1 is connected to a high-potential side power source VH (for example, an ELVDD power source) via capacitance Cp, and the first and second light-emitting elements Y1, Y2 are connected between a drain of the transistor T1 and a low-potential side power source VL (for example, an ELVSS power source). A gate of the transistor Tw is connected to a scanning signal line GL. In the second subpixel S2, the third and fourth light-emitting elements Y3, Y4 are connected between a drain of a transistor T2 and the low-potential side power source VL. In the third subpixel S3, the fifth and sixth light-emitting elements Y5, Y6 are connected between a drain of a transistor T3 and the low-potential side power source VL. The transistors T1 to T3 connected to anodes of the first, third, and fifth light-emitting elements Y1, Y3, Y5 may be P-channel types.

First Embodiment

Figure 2:
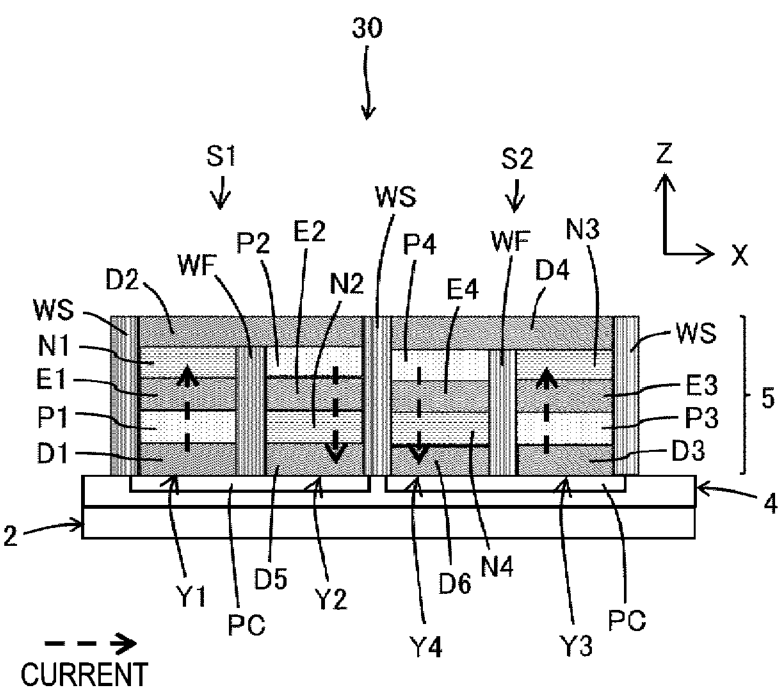
FIG. 2 is a cross-sectional view illustrating a configuration example of the display device according to a first embodiment.

FIG. 2 is a cross-sectional view illustrating a configuration example of the display device according to a first embodiment. As illustrated in FIG. 2, the display device 10 includes a substrate 2, a pixel circuit layer 4 including a plurality of the pixel circuits PC, and a light-emitting element layer 5 including the first to fourth light-emitting elements Y1 to Y4, in this order.

The first subpixel S1 includes the first and second light-emitting elements Y1, Y2 arranged in a planar direction and connected in series. The first and second light-emitting elements Y1, Y2 are partitioned by a first partition WF having insulating properties and emit light of the same color. The first and second subpixels S1, S2 are partitioned by a second partition WS having insulating properties.

The first light-emitting element Y1 includes a first electrode D1, a first hole transport layer P1, a first light-emitting layer E1, and a first electron transport layer N1, in this order, and the second light-emitting element Y2 includes a fifth electrode D5, a second electron transport layer N2, a second light-emitting layer E2, and a second hole transport layer P2, in this order. The first hole transport layer P1 and the second electron transport layer N2 may be adjacent to each other in an X direction (planar direction, direction orthogonal to a Z direction, the Z direction being a thickness direction of the first electrode D1) with the first partition WF interposed therebetween, the first and second light-emitting layers E1, E2 may be adjacent to each other in the X direction with the first partition WF interposed therebetween, and the first electron transport layer N1 and the second hole transport layer P2 may be adjacent to each other in the X direction with the first partition WF interposed therebetween.

In the light-emitting element layer 5, a second electrode D2 covering the first electron transport layer N1 and the second hole transport layer P2 is formed in an upper layer above the first and second light-emitting layers E1, E2. The second electrode D2 shared by the first and second light-emitting elements Y1, Y2 is an island-shaped electrode and functions as a cathode of the first light-emitting element Y1 and an anode of the second light-emitting element Y2. Thus, the first and second light-emitting elements Y1, Y2 are connected in series. When the light-emitting element layer 5 is a top-emitting type, the first and fifth electrodes D1, D5 have light reflectivity and the second electrode D2 is transparent.

In the first subpixel S1, a current path is formed from the pixel circuit PC to the pixel circuit PC via the first electrode D1, the first light-emitting layer E1, the second electrode D2, the second light-emitting layer E2, and the fifth electrode D5, and the first and second light-emitting layers E1, E2 are simultaneously turned on (emit light of the same color) or turned off.

The second subpixel S2 includes third and fourth light-emitting elements Y3, Y4 arranged in the planar direction and connected in series. The third and fourth light-emitting elements Y3, Y4 are partitioned by the first partition WF having insulating properties and emit light of the same color.

The third light-emitting element Y3 includes a third electrode D3, a third hole transport layer P3, a third light-emitting layer E3, and a third electron transport layer N3, in this order, and the fourth light-emitting element Y4 includes a sixth electrode D6, a fourth electron transport layer N4, a fourth light-emitting layer E4, and a fourth hole transport layer P4, in this order. The third hole transport layer P3 and the fourth electron transport layer N4 may be adjacent to each other in the X direction with the first partition WF interposed therebetween, the third and fourth light-emitting layers E3, E4 may be adjacent to each other in the X direction with the first partition WF interposed therebetween, and the third electron transport layer N3 and the fourth hole transport layer P4 may be adjacent to each other in the X direction with the first partition WF interposed therebetween.

In the light-emitting element layer 5, the fourth electrode D4 covering the third electron transport layer N3 and the fourth hole transport layer P4 is formed in an upper layer above the third and fourth light-emitting layers E3, E4. The fourth electrode D4 shared by the third and fourth light-emitting elements Y3, Y4 is an island-shaped electrode and functions as a cathode of the third light-emitting element Y3 and an anode of the fourth light-emitting element Y4. Thus, the third and fourth light-emitting elements Y3, Y4 are connected in series. When the light-emitting element layer 5 is a top-emitting type, the third and sixth electrodes D3, D6 have light reflectivity and the fourth electrode D4 is transparent.

In the second subpixel S2, a current path is formed from the pixel circuit PC to the pixel circuit PC via the third electrode D3, the third light-emitting layer E3, the fourth electrode D4, the fourth light-emitting layer E4, and the sixth electrode D6, and the third and fourth light-emitting layers E3, E4 simultaneously turn on (emit light of the same color) or turn off.

The second electrode D2 and the fourth electrode D4 are disposed in the same layer, separated from each other so as not to be short-circuited. For the second and fourth electrodes D2, D4, a transparent oxide film such as IZO, ZnO, AZO, or ITO, for example, can be used, but the material is not limited thereto. A metal (Ag, Al, Cu, Au, or the like) in the form of an ultra-thin layer, nanoparticles, or nanowires can also be used. The second and fourth electrodes D2, D4 may be made of a common material, or at least two of the electrode materials may be made different from each other.

The fifth electrode D5 and the sixth electrode D6 may be electrically connected or may be integrated. A light transmittance of the second partition WS may be less than a light transmittance of the first partition WF. The first partition WF may be transparent and the second partition WS may be light-blocking. A thickness (height) of the second partition WS may be greater than that of the first partition WF, and the second partition WS may electrically insulate the second electrode D2 and fourth electrode D4 (described below).

In the first embodiment, for example, the first and second light-emitting layers E1, E2 arranged in a planar manner can be disposed in the current path of the first subpixel S1, making it possible to increase an external quantum efficiency (EQE) of the first subpixel S1. With the first and second light-emitting layers E1, E2 being arranged in a planar direction, the layer quantity can be reduced as compared with a tandem arrangement in which a plurality of light-emitting layers are arranged in a thickness direction of a light-emitting diode (LED). The same applies to the second subpixel S2.

The second electrode D2 of the first subpixel S1 and the fourth electrode D4 of the second subpixel S2 are electrically insulated from each other, making luminance control for each subpixel easy as compared with a configuration in which these electrodes having a large resistance value due to being transparent electrodes are electrically connected to each other.

In the first and second subpixels S1, S2, the fifth and sixth electrodes D5, D6 connected to the low-potential side power source (ELVSS) can be integrated, and thus making a power source line common in the pixel circuit layer 5.

In the first subpixel S1, the first and second light-emitting layers E1, E2 may be made of a common material, the first and second hole transport layers P1, P2 may be made of a common material, and the first and second electron transport layers N1, N2 may be made of a common material. Such a configuration reduces luminance unevenness between the first and second light-emitting elements Y1, Y2, and facilitates luminance control of the first subpixel S1. Further, such a configuration makes it possible to reduce the number of manufacturing processes and reduce material costs. The same applies to the second subpixel S2.

Figure 4:
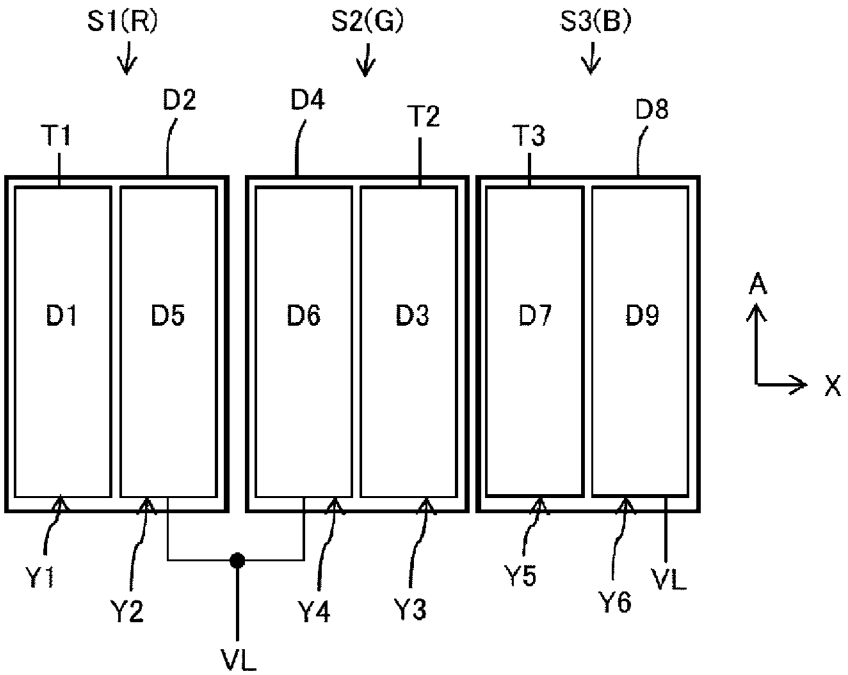
FIG. 4 is a schematic plan view illustrating a configuration example of a display portion.

In the first subpixel S1, as illustrated in FIG. 4, desirably the first and fifth electrodes D1, D5 have longitudinal shapes, and an edge of the first electrode D1 in a longitudinal direction (A direction) and an edge of the fifth electrode D5 in the longitudinal direction (A direction) are adjacent to each other. With such a configuration, in the second electrode D2 overlapping the entire first electrode D1 and the entire fifth electrode D5 in plan view (as viewed in the Z direction), it is possible to suppress in-plane potential variation that may occur due to a high resistance value (because of the transparent electrodes). The same applies to the second subpixel S2.

In the first subpixel S1, the first electrode D1 (anode) and the fifth electrode D5 (cathode) may be made of a common material. In this case, the common material preferably has a work function within a band gap of the first and second light-emitting layers E1, E2. This is because such a work function facilitates injection of positive holes and electrons (reduces an energy barrier for positive holes and electrons). When the first and second light-emitting layers E1, E2 are quantum dot light-emitting layers, the common material preferably has a work function within a range of 3.6 eV to 5.6 eV. Specific examples thereof include ITO, IZO, Ag, and Al.

Further, materials of the first electrode D1 that comes into contact with the first hole transport layer P1 may be the same as materials of the second electrode D2 that comes into contact with the second hole transport layer P2, and materials of the second electrode D2 that comes into contact with the first electron transport layer N1 may be the same as materials of the fifth electrode D5 that comes into contact with the second electron transport layer N2. Such a configuration reduces the luminance unevenness between the first and second light-emitting elements Y1, Y2. Specifically, a layered film of an Al film or an Ag film and an ITO film (ITO being an upper layer) may be used in common for the first and fifth electrodes D1, D5, and an ITO film may be used for the second electrode D2. Alternatively, a layered film of an Al film or an Ag film and an IZO film (IZO being an upper layer) may be used in common for the first and fifth electrodes D1, D5, and an IZO film may be used for the second electrodes D2. A thick Al film may be used in common for the first and fifth electrodes D1, D5, and Al in the form of nanowires may be used for the second electrode D2. A thick Ag film may be used in common for the first and fifth electrodes D1, D5, and an ultra-thin Ag film may be used for the second electrode D2. A metal film such as an Al film or an Ag film can be formed by vapor deposition, sputtering, or the like. Metal nanowires or metal nanoparticles can be formed by coating, an ink-jet method, or the like. The same applies to the second subpixel S2.

As the first light-emitting layers E1 to E4, a quantum dot light-emitting layer including quantum dots (for example, semiconductor nanocrystal particles), an organic light-emitting layer, or the like can be used. Examples of the material of the quantum dot include ZnSe, ZnS, ZnTe, ZnTeSe, CdSe, CDs, CdZnSe, InP, and Si. Further, for the quantum dot, a core/shell structure such as CdSe/CdS, CdSe/ZnS, InP/ZnS, ZnSe/ZnS, or CIGS/ZnS can also be used. A quantum dot light-emitting layer can be easily formed using a coating method, an ink-jet method, or the like. An organic light-emitting layer can be formed using vapor deposition, an ink-jet method, or the like.

A maximum diameter of the quantum dot need only be 100 nm or less, and the shape is not limited to a spherical shape. For example, the shape may be a polyhedral shape, an ellipsoidal shape, a rod shape, a branched three-dimensional shape, or a three-dimensional shape with an uneven surface, or may be a combination of these shapes.

The first to fourth hole transport layers P1 to P4 can use an organic material such as PEDOT:PSS, TFB, TPD, or PVK or an inorganic material such as NiO, MgNiO, $WO_3$, $MoO_3$, or CuSCN, can adopt a single layer or a layered structure of these materials, and can be formed by a coating method, an ink-jet method, vapor deposition, sputtering, or the like. The inorganic material may be crystalline, amorphous, or nanoparticles. The first to fourth electron transport layers N1 to N4 can be formed by a coating method, an ink-jet method, sputtering, or the like using an inorganic material such as ZnO, ZnMgO, $TiO_2$, $SnO_2$, or $In_2O_3$. The inorganic material may be crystalline, amorphous, or nanoparticles.

Figure 3:
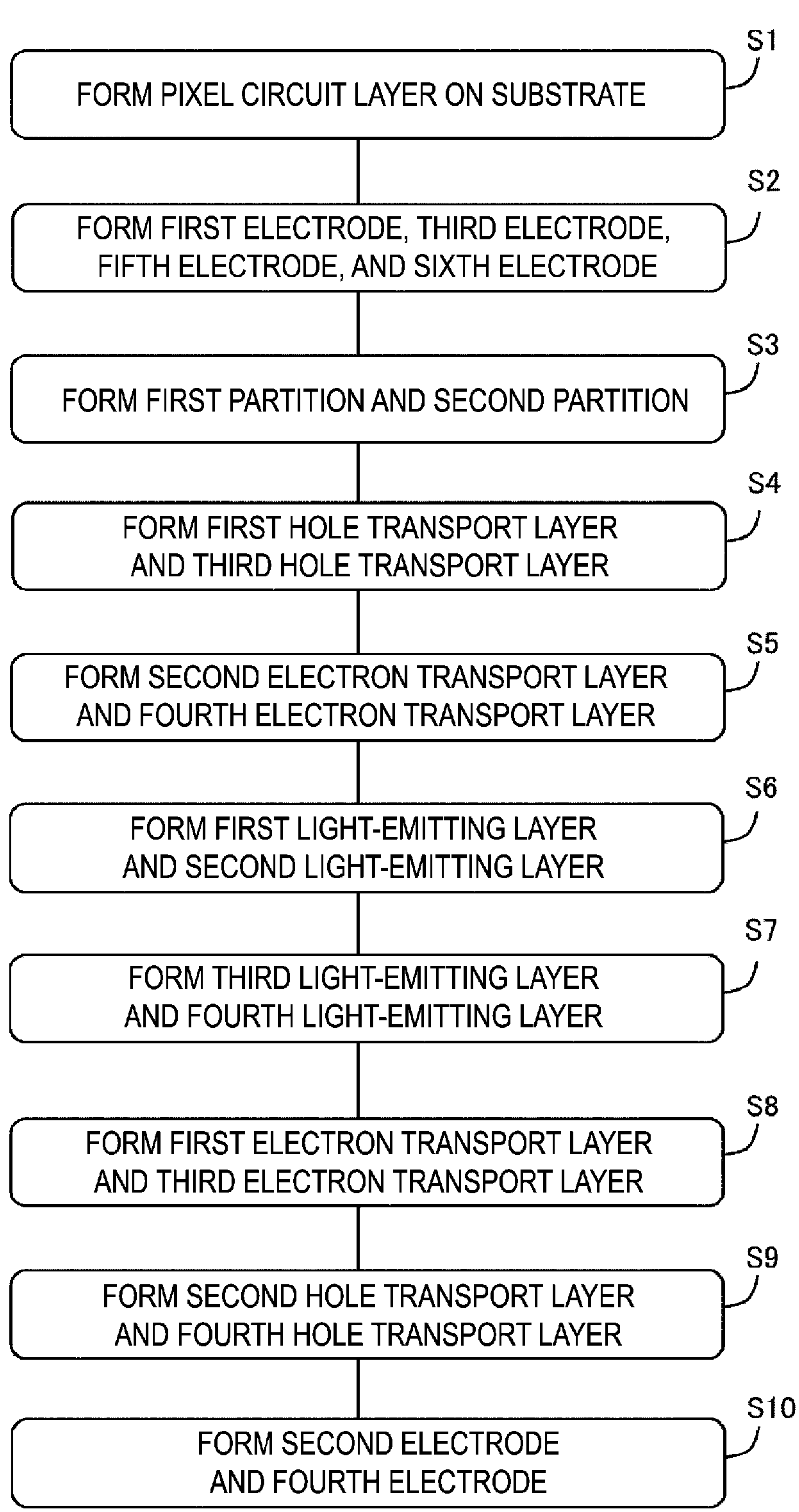
FIG. 3 is a flowchart illustrating a method for manufacturing the display device according to the first embodiment.

FIG. 3 is a flowchart illustrating an example of a method for manufacturing the display device according to the first embodiment. As illustrated FIG. 2 and FIG. 3, in step S1, the pixel circuit layer 4 including the plurality of pixel circuits PC is formed on the substrate 2. Here, a layered body including a semiconductor film, an electrode, a wiring line, and an insulating film is formed over a glass substrate, a flexible substrate, or the like, and an organic film (flattening film) of polyimide or the like is formed on the layered body.

In step S2, the first, third, fifth, and sixth electrodes D1, D3, D5, D6 are formed on the flattening film. Here, a layered film of Al/IZO or an Ag film is simultaneously formed as these electrodes D1, D3, D5, D6 by using sputtering, or the like. When the anode and the cathode are made of different materials, the fifth and sixth electrodes D5, D6 (cathodes) may be formed after the first and third electrodes D1, D3 (anodes) are formed. The fifth electrode D5 and the sixth electrode D6 may be integrally formed. In step S3, the first partition WF and the second partition WS are formed using an organic film such as polyimide.

In step S4, the first hole transport layer P1 and the third hole transport layer P3 are formed. Here, an ink in which nanoparticles of NiO, MgNiO, or the like are dispersed in a polar solvent (ethylene glycol, alcohol, or the like) is ejected (ink-jetted) to a predetermined region, and then the solvent is removed. Furthermore, an ink including an organic material such as TFB, TPD, or PVK may be ejected (ink-jetted) to a predetermined region and then the solvent may be removed to form a layered structure. In step S5, the second electron transport layer N2 and the fourth electron transport layer N4 are formed. Here, an ink in which nanoparticles of ZnO, ZnMgO, or the like are dispersed in a polar solvent is ejected (ink-jetted) to a predetermined region, and then the solvent is removed.

In step S6, the first light-emitting layer E1 and the second light-emitting layer E2 are formed. Here, for example, an ink in which red light-emitting quantum dots are dispersed in a non-polar solvent (toluene, hexane, or the like) is ejected (ink-jetted) to a predetermined region, and then the solvent is removed. In step S7, the third light-emitting layer E3 and the fourth light-emitting layer E4 are formed. Here, for example, an ink in which green light-emitting quantum dots are dispersed in a non-polar solvent is ejected (ink-jetted) to a predetermined region, and then the solvent is removed.

In step S8, the first electron transport layer N1 and the third electron transport layer N3 are formed. Here, an ink in which nanoparticles of ZnO, ZnMgO, or the like are dispersed in a polar solvent is ejected (ink-jetted) to a predetermined region, and then the solvent is removed. In step S9, the second hole transport layer P2 and the fourth hole transport layer P4 are formed. Here, an ink in which nanoparticles of NiO, MgNiO, or the like are dispersed in a polar solvent is ejected (ink-jetted) to a predetermined region, and then the solvent is removed. Before that, an ink including an organic material such as TFB, TPD, or PVK may be ejected (ink-jetted) to a predetermined region and then the solvent may be removed to form a layered structure.

In step S10, the second electrode D2 and the fourth electrode D4 are formed. Here, IZO or Ag ultra-thin films are simultaneously formed as these electrodes D2, D4 by sputtering, or the like. More specifically, transparent oxide materials such as IZO, ITO, ZnO, and AZO can be formed by sputtering, vapor deposition, or other methods to a film thickness of about 10 to 100 nm, or a metal film (Al film, Ag film, or the like) formed into an ultra-thin layer of about 5 to 30 nm (to the extent that light transmittance occurs) can be formed by sputtering, vapor deposition, or other methods. For patterning, a mask including an opening divided on a per subpixel basis can be used.

According to the manufacturing method of FIG. 3, the first to fourth light-emitting layers E1 to E4 are formed by an ink-jet method, facilitating patterning. Further, the first to fourth hole transport layers P1 to P4 and the first to fourth electron transport layers N1 to N4 are formed by an ink-jet method, facilitating patterning.

With polar solvents being used in the inks of the first to fourth hole transport layers P1 to P4 and the first to fourth electron transport layers N1 to N4, and non-polar solvents being used in the inks of the first to fourth light-emitting layers E1 to E4, the influence of interlayer solvent interference is reduced.

Metal nanoparticles are used in the second and fourth hole transport layers P2, P4 and the first and third electron transport layers N1, N3 positioned in upper layers above the first to fourth light-emitting layers E1 to E4, eliminating the need for high-temperature heat treatment. Thus, thermal damage to the first to fourth light-emitting layers E1 to E4 can be reduced.

FIG. 3 is merely an example of the manufacturing method, and steps may be interchanged, or steps may be added or deleted.

Figure 5:
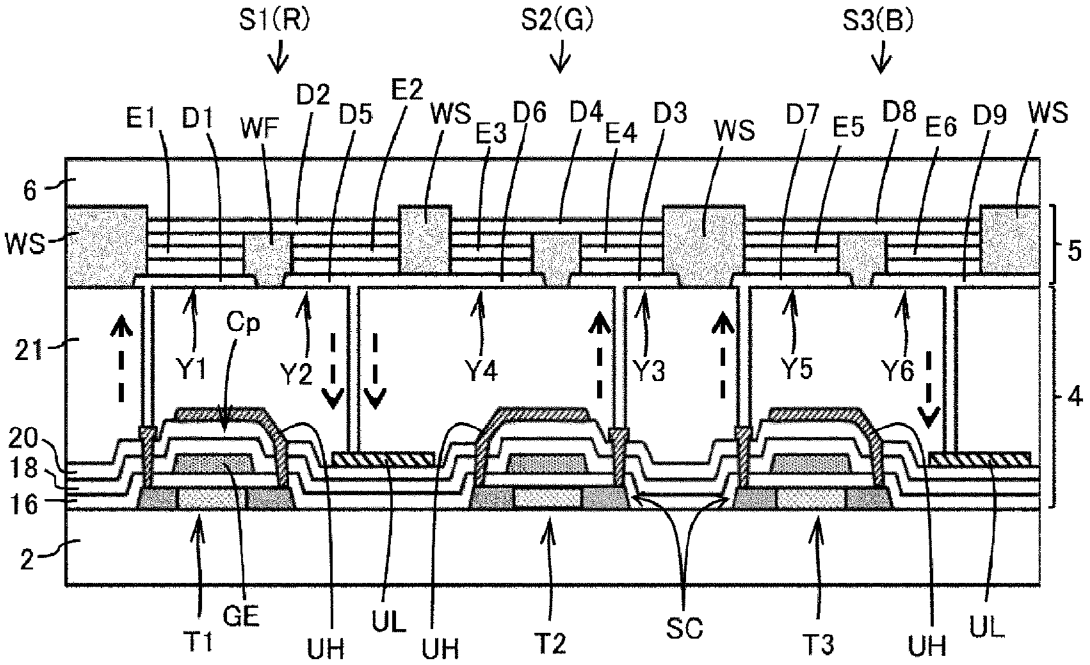
FIG. 5 is a cross-sectional view illustrating the configuration example of a display portion.

FIG. 4 is a schematic plan view illustrating a configuration example of the display portion. FIG. 5 is a cross-sectional view illustrating the configuration example of the display portion. As illustrated in FIG. 4 and FIG. 5, a configuration can be adopted in which the first subpixel S1 emits light of a first color (red, for example), the second subpixel S2 emits light of a second color (green, for example), and the third subpixel S3 emits light of a third color (blue, for example). The first to third subpixels S1 to S3 may constitute one pixel.

The first and second subpixels S1, S2 are as described above. The third subpixel S3 includes the fifth light-emitting element Y5 including a seventh electrode D7 and a fifth light-emitting layer E5, and the sixth light-emitting element Y6 including a ninth electrode D9 and a sixth light-emitting layer E6, and the fifth and sixth light-emitting elements Y5, Y6 are arranged in the planar direction and connected in series. The fifth and sixth light-emitting elements Y5, Y6 are partitioned by the first partition WF having insulating properties and emit light of the same color (blue).

An eighth electrode D8 shared by the fifth and sixth light-emitting elements Y5, Y6 is an island-shaped electrode and functions as a cathode of the fifth light-emitting element Y5 and an anode of the sixth light-emitting element Y6. Thus, the fifth and sixth light-emitting elements Y5, Y6 are connected in series. When the light-emitting element layer 5 is a top-emitting type, the seventh and ninth electrodes D7, D9 have light reflectivity and the eighth electrode D8 is transparent.

The first and second light-emitting elements Y1, Y2 are surrounded by the second partition WS that is higher than the first partition WF, the third and fourth light-emitting elements Y3, Y4 are surrounded by the second partition WS, and the fifth and sixth light-emitting elements Y5, Y6 are surrounded by the second partition WS.

The substrate 2 is made of glass, flexible resin, or the like. The top layer of the substrate 2 may be a barrier layer configured to block foreign matter such as water and oxygen (inorganic insulating film such as silicon nitride, for example).

The pixel circuit layer 4 includes a semiconductor film SC, a gate insulating film 16, a first inorganic insulating film 18, a second inorganic insulating film 20, and an interlayer insulating film 21. Each of the transistors T1 to T3 (drive transistors) includes a gate electrode GE and a semiconductor film SC functioning as a channel. The semiconductor film SC is formed of low-temperature polysilicon (LTPS), an oxide semiconductor, or the like. LTPS, an oxide semiconductor, or the like can function as a source or a drain of each transistor as well as a wiring line or an electrode by being subjected to conductor formation treatment. The interlayer insulating film 21 is a flattening film, and may be formed of, for example, a coatable organic material, such as a polyimide or an acrylic resin.

In the pixel circuit layer 4, the drain of the transistor T1 (P-channel type) is connected to the first electrode D1 (anode) via a contact hole of the flattening film 21, a source of the transistor T1 is connected to a high-potential side power source line UH, and the capacitance Cp is formed between the gate GE of the transistor T1 and the high-potential side power source line UH. The integrated fifth and sixth electrodes D5, D6 (cathodes) are connected to a low-potential side power source line UL via a contact hole of the flattening film 21. The high-potential side power source line UH is connected to the high-potential side power source line VH (ELVDD power source) illustrated in FIG. 1, and the low-potential side power source line UL is connected to the low-potential side power source VL (ELVSS power source) illustrated in FIG. 1.

Similarly, a source of the transistor T2 (P-channel type) is connected to the high-potential side power source line UH, and the drain of the transistor T2 is connected to the third electrode D3 (anode) via a contact hole. A source of the transistor T3 (P-channel type) is connected to the high-potential side power source line UH, and the drain of the transistor T3 is connected to the seventh electrode D7 (anode) via a contact hole. The ninth electrode D9 (cathode) is connected to the low-potential side power source line UL via a contact hole.

In FIG. 5, the first and second partitions WF, WS can be made to function as edge covers of the electrodes (D1, D3, D5, D6, D7, D9) on the interlayer insulating film 21. The second electrode D2, the fourth electrode D4, and the eighth electrode D8 can be insulated from each other by the second partition WS having a large thickness. In the first and second subpixels S1, S2, the fifth and sixth electrodes D5, D6 connected to the low-potential side power source (ELVSS) can be integrated, thus making the low-potential side power source line UL and the contact hole common. By providing the sealing film 6 on the light-emitting element layer 5, it is possible to prevent entry of foreign matter such as oxygen or water.

Light-emitting areas of the first and second light-emitting layers E1, E2 (areas of overlap with the anode and the cathode in the light-emitting layers) may be equal to each other, light-emitting areas of the third and fourth light-emitting layers E3, E4 may be equal to each other, and light-emitting areas of the fifth and sixth light-emitting layers E5, E6 may be equal to each other. A sum of the light-emitting areas of the first and second light-emitting layers E1, E2, a sum of the light-emitting areas of the third and fourth light-emitting layers E3, E4, and a sum of the light-emitting areas of the fifth and sixth light-emitting layers E5, E6 may be different from each other.

Figure 6:
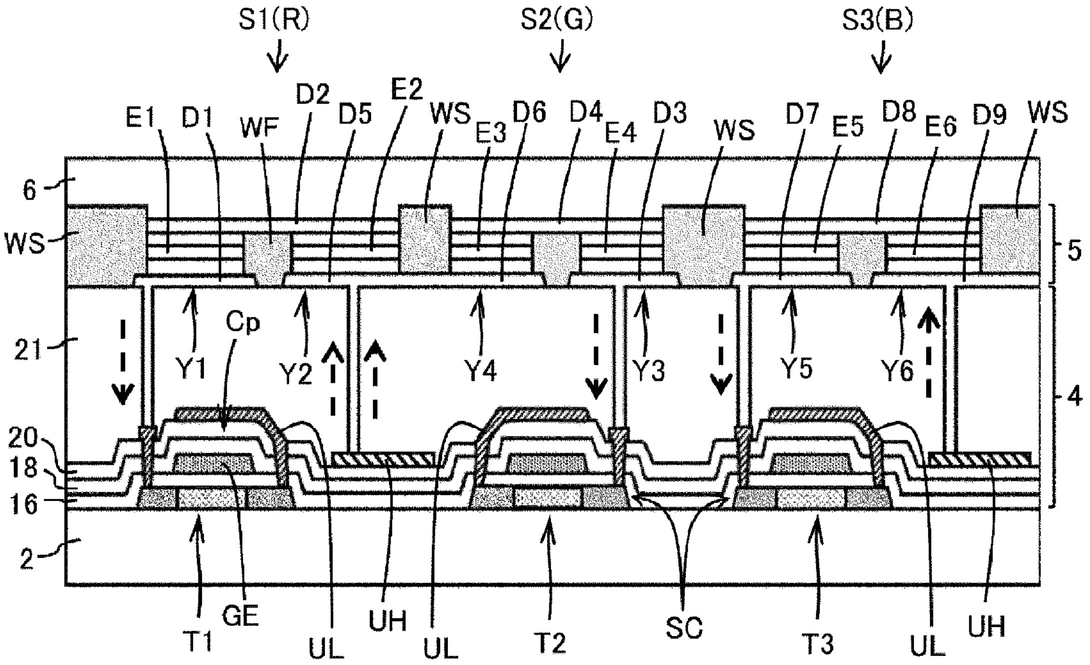
FIG. 6 is a cross-sectional view illustrating another configuration example of the display portion.
Figure 7:
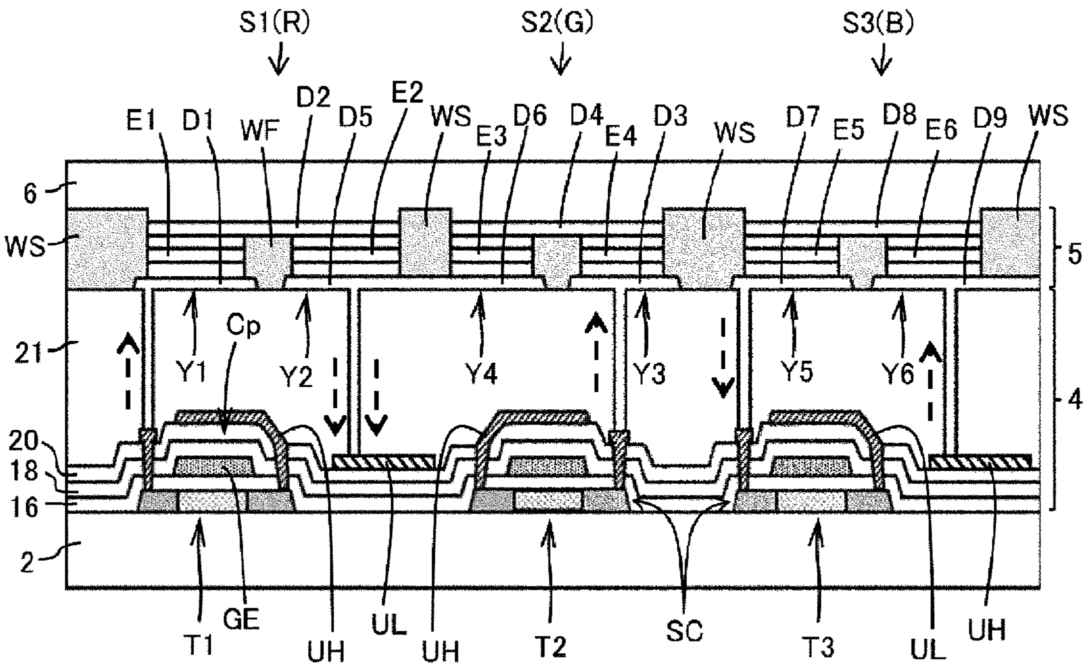
FIG. 7 is a cross-sectional view illustrating another configuration example of the display portion.

FIG. 6 and FIG. 7 are cross-sectional views illustrating another configuration example of the display portion. In FIG. 5, the transistors T1 to T3 (for example, P-channel types) are connected to the anodes (D1, D3, D7) of the light-emitting elements Y1, Y3, Y5, but the connections are not limited thereto. As illustrated in FIG. 6, the transistors T1 to T3 (for example, N-channel types) may be connected to the cathodes (D1, D3, D7) of the light-emitting elements Y1, Y3, Y5. In this case, a configuration need only be adopted in which the hole transport layers and the electron transport layers of the light-emitting elements Y1 to Y6 are interchanged with each other. Further, as illustrated in FIG. 7, the transistors T1, T2 (for example, P-channel types) may be connected to the anodes (D1, D3) of the light-emitting elements Y1, Y3, and the transistor T3 (for example, N-channel type) may be connected to the cathode (D7) of the light-emitting element Y5. In this case, a configuration need only be adopted in which the hole transport layers and the electron transport layers of the light-emitting elements Y5, Y6 are interchanged with each other.

Second Embodiment

Figure 8:
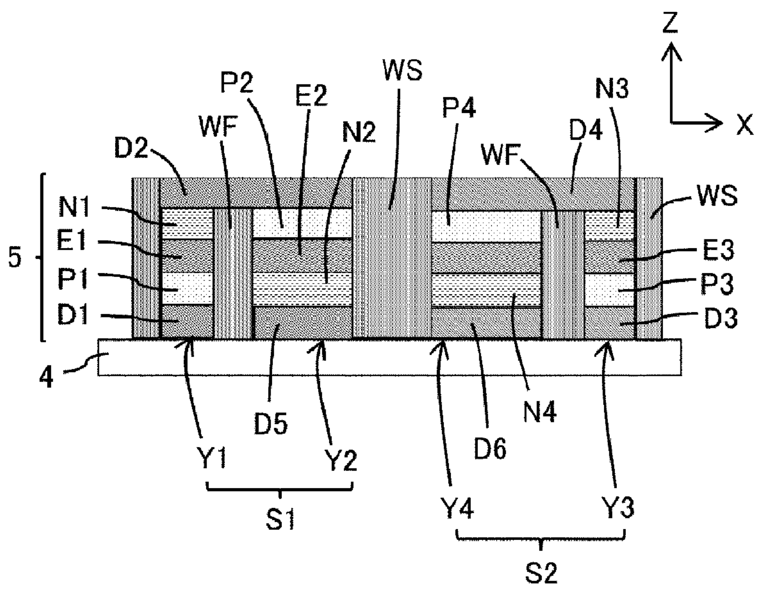
FIG. 8 is a cross-sectional view illustrating a configuration example of the display device according to a second embodiment.
Figure 9:
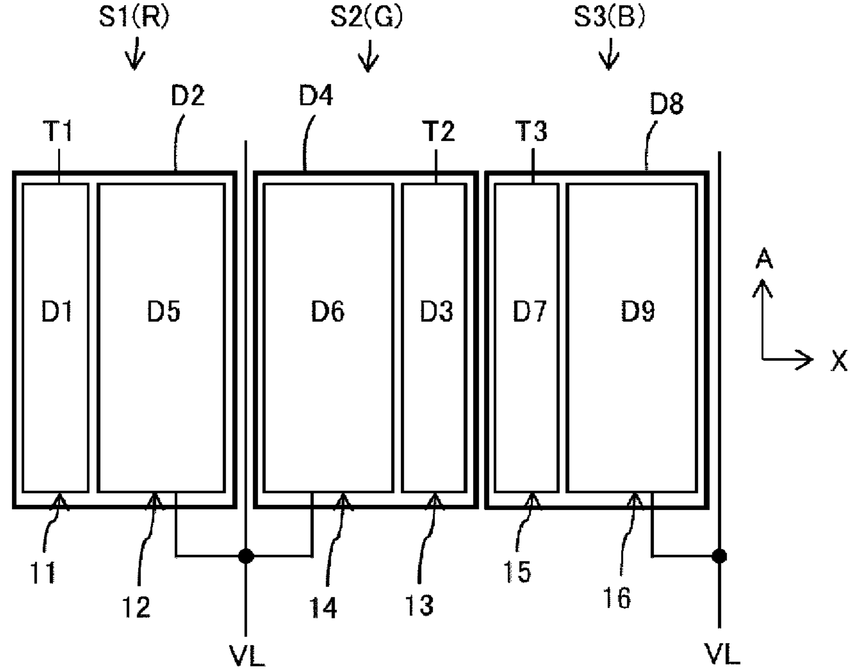
FIG. 9 is a schematic plan view illustrating a configuration example of the display portion.

FIG. 8 is a cross-sectional view illustrating a configuration example of the display device according to a second embodiment. FIG. 9 is a schematic plan view illustrating a configuration example of the display portion. As illustrated in FIG. 8 and FIG. 9, areas of the light-emitting elements in the subpixel can be different and, for example, the light-emitting area of the first light-emitting layer E1 may be smaller than the light-emitting area of the second light-emitting layer E2, and the light-emitting area of the third light-emitting layer E3 may be smaller than the light-emitting area of the fourth light-emitting layer E4.

In this case, in the first subpixel S1, an effective size of the first light-emitting element Y1 (overlapping area of the first electrode D1, the first hole transport layer P1, the first light-emitting layer E1, the first electron transport layer N1, and the second electrode D2) is smaller than an effective size of the second light-emitting element Y2 (overlapping area of the fifth electrode D5, the second electron transport layer N2, the second light-emitting layer E2, the second hole transport layer P2, and the second electrode D2). In the second subpixel S2, an effective size of the third light-emitting element Y3 (overlapping area of the third electrode D3, the third hole transport layer P3, the third light-emitting layer E3, the third electron transport layer N3, and the fourth electrode D4) is smaller than an effective size of the fourth light-emitting element Y4 (overlapping area of the sixth electrode D6, the fourth electron transport layer N4, the fourth light-emitting layer E4, the fourth hole transport layer P4, and the fourth electrode D4).

Figure 10:
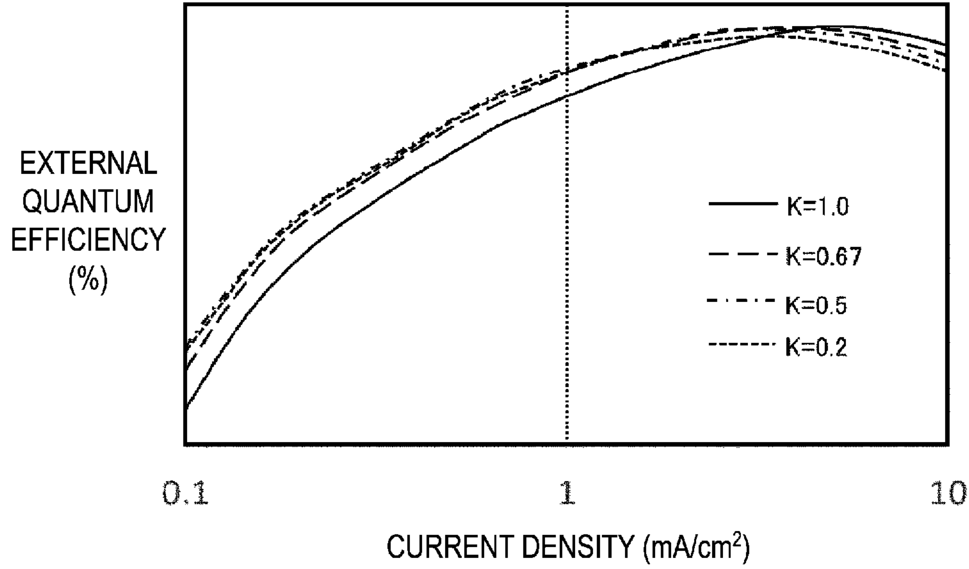
FIG. 10 is a graph showing a relationship between a current density and an external quantum efficiency of light-emitting elements connected in series according to a difference in effective size ratio.

FIG. 10 is a graph showing a relationship between a current density and an external quantum efficiency (EQE) of two light-emitting elements connected in series according to a difference in an effective size ratio K. The effective size ratio K is defined as the effective size (light-emitting area) of the smaller light-emitting element/the effective size (light-emitting area) of the larger light-emitting element. From FIG. 10, it is understood that, with the effective size ratio K set to 0.67 or less, a current density dependence of EQE is flattened and, in particular, EQE in a low current density region of 3.0 $mA/cm^2$ or less is increased.

In the configuration illustrated in FIGS. 8 and 9, by setting the effective size ratio K of the first light-emitting element Y1 and the second light-emitting element Y2 to 0.67 or less and the effective size ratio K of the third light-emitting element Y3 and the fourth light-emitting element Y4 to 0.67 or less, it is possible to flatten the current density dependence of the external quantum efficiencies (EQEs) of the subpixels S1, S2. For example, in the first subpixel S1, because the current values of the first and second light-emitting elements Y1, Y2 are the same, the current density is inversely proportional to the effective size, and light is emitted at different current densities. The improvement in EQE in the low current density region at an effective size ratio of 0.67 or less is thought to be due to a reduced leakage current caused by the increased current density of the smaller light-emitting element (Y1). The same applies to the second subpixel S2.

The embodiments described above are for the purpose of illustration and description and are not intended to be limiting. It will be apparent to those skilled in the art that many variations will be possible in accordance with these examples and descriptions.

The invention claimed is:

1. A display device comprising:

a first subpixel including a first light-emitting element and a second light-emitting element connected in series; and a second subpixel including a third light-emitting element and a fourth light-emitting element connected in series, wherein the first light-emitting element includes a first electrode and a first light-emitting layer, the second light-emitting element includes a second light-emitting layer, the first light-emitting element and the second light-emitting element share a second electrode formed in an upper layer above the first light-emitting layer and the second light-emitting layer, the third light-emitting element includes a third electrode and a third light-emitting layer, the fourth light-emitting element includes a fourth light-emitting layer, the third light-emitting element and the fourth light-emitting element share a fourth electrode formed in an upper layer above the third light-emitting layer and the fourth light-emitting layer, the second electrode is an island-shaped electrode and functions as a cathode of one of the first light-emitting element and the second light-emitting element and an anode of the other, and the fourth electrode is an island-shaped electrode and functions as a cathode of one of the third light-emitting element and the fourth light-emitting element and an anode of the other.

2. The display device according to claim 1, wherein the second electrode and the fourth electrode are transparent and electrically insulated from each other.

3. The display device according to claim 1- or 2, wherein the first light-emitting element and the second light-emitting element are adjacent to each other in a direction orthogonal to a thickness direction of the first electrode and emit light of the same color, and the third light-emitting element and the fourth light-emitting element are adjacent to each other in a direction orthogonal to a thickness direction of the third electrode and emit light of the same color.

4. The display device according to claim 3, wherein the first subpixel and the second subpixel emit light of colors different from each other.

5. The display device according to claim 1, wherein the second electrode and the fourth electrode are formed in the same layer, separated from each other.

6. The display device according to claim 1, wherein the display device is a top-emitting type that extracts light from an upper side.

7. The display device according to claim 1, wherein the second light-emitting element includes a fifth electrode, the fourth light-emitting element includes a sixth electrode, and the fifth electrode and the sixth electrode are electrically connected.

8. The display device according to claim 1, wherein the first electrode functions as an anode of the first light-emitting element, and the third electrode functions as an anode of the third light-emitting element.

9. The display device according to claim 1, wherein the first electrode functions as a cathode of the first light-emitting element, and the third electrode functions as a cathode of the third light-emitting element.

10. The display device according to claim 7, wherein the first electrode and the third electrode as well as the fifth electrode and the sixth electrode are light-reflecting electrodes.

11. The display device according to claim 8, comprising:

a transistor connected to the first electrode; and a transistor connected to the third electrode.

12. The display device according to claim 7, wherein the first electrode, the second electrode, and the fifth electrode include the same material.

13. The display device according to claim 7, wherein a first partition is provided between the first light-emitting element and the second light-emitting element, the first light-emitting element includes a first hole transport layer, the first light-emitting layer, and a first electron transport layer, between the first electrode and the second electrode, the second light-emitting element includes a second hole transport layer, the second light-emitting layer, and a second electron transport layer, between the second electrode and the fifth electrode, the first hole transport layer and the second electron transport layer are adjacent to each other with the first partition interposed therebetween, and the first electron transport layer and the second hole transport layer are adjacent to each other with the first partition interposed therebetween.

14. The display device according to claim 13, wherein the first hole transport layer and the second hole transport layer include the same material, the first light-emitting layer and the second light-emitting layer include the same material, and the first electron transport layer and the second electron transport layer include the same material.

15. The display device according to claim 1, wherein a light-emitting area of the first light-emitting element differs from a light-emitting area of the second light-emitting element.

16. The display device according to claim 7, wherein the second light-emitting element and the fourth light-emitting element are adjacent to each other with a second partition interposed therebetween.

17. The display device according to claim 16, wherein the fifth electrode and the sixth electrode are adjacent to each other with the second partition interposed therebetween.

18. The display device according to claim 1, wherein each of the first light-emitting layer and the second light-emitting layer is a quantum dot light-emitting layer.

19. The display device according to claim 1, comprising:

a third subpixel including a fifth light-emitting element and a sixth light-emitting element connected in series, wherein the fifth light-emitting element includes a seventh electrode and a fifth light-emitting layer, the sixth light-emitting element includes a sixth light-emitting layer, the fifth light-emitting element and the sixth light-emitting element share an eighth electrode formed in an upper layer above the fifth light-emitting layer and the sixth light-emitting layer, and the eighth electrode is an island-shaped electrode and functions as a cathode of one of the fifth light-emitting element and the sixth light-emitting element and an anode of the other.

20. The display device according to claim 19, wherein the third subpixel emits light of a color different from a color of each of the first subpixel and the second subpixel.

* * * * *